(12) United States Patent
O'Neill

(10) Patent No.: US 6,185,121 B1
(45) Date of Patent: Feb. 6, 2001

(54) ACCESS STRUCTURE FOR HIGH DENSITY READ ONLY MEMORY

(75) Inventor: Jay Henry O'Neill, Freehold, NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/031,010

(22) Filed: Feb. 26, 1998

(51) Int. Cl.[7] .................................................. H01L 29/78
(52) U.S. Cl. ................................. 365/94; 365/51; 365/63
(58) Field of Search .................................. 365/94, 51, 52, 365/63, 230.06; 257/210, 211

(56) References Cited

U.S. PATENT DOCUMENTS

| | | | |
|---|---|---|---|
| 4,736,342 | * 4/1988 | Imondi et al. | 365/94 X |
| 5,408,428 | * 4/1995 | Burgess et al. | 365/94 |
| 5,432,730 | * 7/1995 | Shubat et al. | 365/94 X |
| 5,835,396 | * 11/1998 | Zhang | 365/94 X |
| 5,847,442 | * 12/1998 | Mills, Jr. et al. | 257/536 |

* cited by examiner

*Primary Examiner*—A. Zarabian
(74) *Attorney, Agent, or Firm*—Eugene J. Rosenthal

(57) ABSTRACT

A high density read only memory structure is arranged to have the decoders and selectors which are used to access the read only memory arrays in a layer which is above and/or below the read only memory array layers. Note that by layer it is meant a substantially planar structure with some thickness in which the circuitry that makes up particular functionality resides. Thus, the inefficient two-dimensional structure of the prior art is folded over to create a compact read only memory device with a three-dimensional structure. Connection of the decoders to the rows is not limited to the ends of the rows, but instead may be made at any point along the rows. Similarly, connection of the selectors to the columns is not limited to the ends of the columns, but instead may be made at any point along the columns. Advantageously, additional circuitry is not required on the periphery of the memory array, so that a smaller overall memory device is achieved. In addition, in order to reduce cross talk when reading the memory array with a low impedance amplifier, the memory is addressed using a single active row, and, it is read only one column at a time.

12 Claims, 4 Drawing Sheets

US 6,185,121 B1

ACCESS STRUCTURE FOR HIGH DENSITY READ ONLY MEMORY

TECHNICAL FIELD

This invention relates to the read only memory structures, and more particularly, the arrangement of circuitry for reducing the area required to access a high density read only memory.

BACKGROUND OF THE INVENTION

A well known problem in the art of read only memories is that the circuitry required to access, i.e., to address and read the memory, requires area on the memory chip, because the memory cells are read using decoders and selectors located on the periphery of the memory array. According to the prior art, the more dense the memory array, the more area required for the decoders and selectors relative to the memory array area. As a result, for a very high density memory array, such as is disclosed in U.S. patent application Ser. No. 08/748,035, now U.S. Pat. No. 5,847,442 which is assigned to the same assignee as the present invention and is incorporated by reference as if set forth fully herein, it is impractical to use prior art access techniques, because the area overhead required for the decoders and selectors essentially negates the advantage of the increased memory density.

SUMMARY OF THE INVENTION

I have recognized that the problems with accessing high density read only memory arrays can be avoided, in accordance with the principles of the invention, by placing the decoders and selectors which are used to access the read only memory array in another layer which is above and/or below the read only memory array layers. Note that by layer it is meant a substantially planar structure with some thickness in which the circuitry that makes up particular functionality resides. Thus, the inefficient two-dimensional structure of the prior art is folded over to create a compact read only memory device with a three-dimensional structure. In accordance with an aspect of the invention, connection of the decoders to the rows is not limited to the ends of the rows, but instead may be made at any point along the rows. Similarly, connection of the selectors to the columns is not limited to the ends of the columns, but instead may be made at any point along the columns. Advantageously, additional circuitry is not required on the periphery of the memory array, so that a smaller overall memory device is achieved. In addition, in order to reduce cross talk when reading the memory array with a low impedance amplifier, the memory is addressed using a single active row, and, in accordance with an aspect of the invention, it is read only one column at a time.

DETAILED DESCRIPTION

Figure 1:
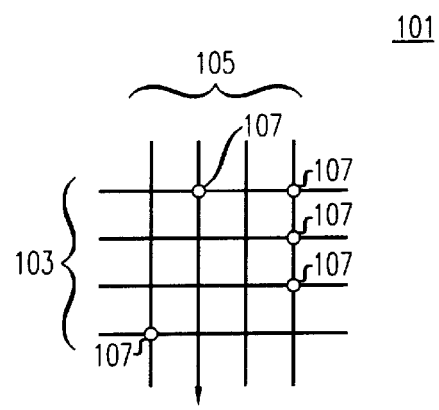
FIG. 1 shows an exemplary prior art layer of read-only memory (ROM)

FIG. 1 shows an prior art exemplary layer of read-only memory (ROM) 101. ROM 101 includes rows of wires 103, columns of wires 105, and interconnects 107. Rows 103 and columns 105, are in different planes, so that they do not intersect. Although they need not be perpendicular to each other, rows of wires 103 and columns of wires 105 are arranged so that they cross each other. The presence of one of interconnects 107 at a row and column crossing yields information that is permanently stored thereat. Interconnects 107 may be a resistor with a higher resistance than the materials making up rows of wires 103 and columns of wires 105, a non-linear element such as a diode transistor, or the like. Note that more than one bit of information can be represented at a crossing of a single row and a single column, depending on the type of interconnect used. For example, if resistors of different 16 values were employed, each crossing could represent four bits.

Figure 2:
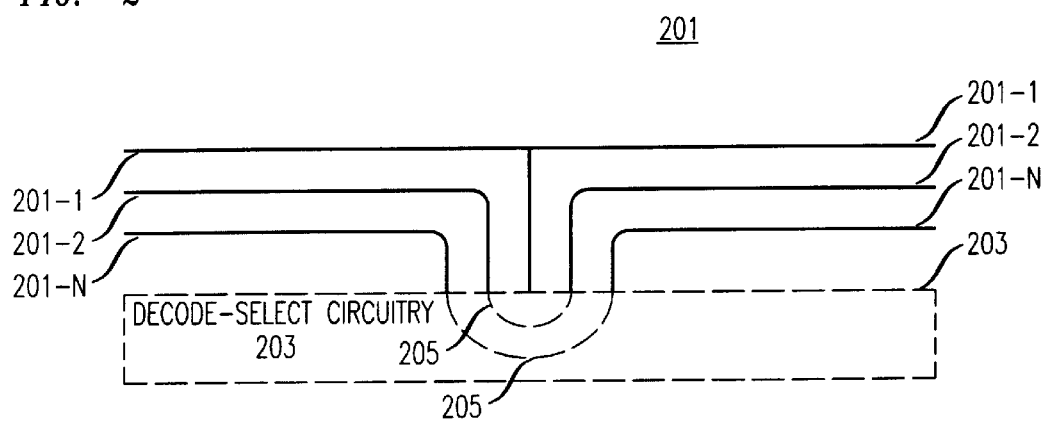
FIG. 2 shows a cross-sectional view of an arrangement of multiple arrays of read-only memory, in accordance with the principles of the invention.

FIG. 2 shows a cross-sectional view of an arrangement of multiple arrays of read-only memory 201, which included read only memory arrays 201-1 through 201-N, each of which is located in a separate layer, in accordance with an aspect of the invention. Each of memory arrays 201 is similar in structure to ROM 101. Located below memory arrays 201, in accordance with the principles of the invention, is decode-select circuitry 203. Decode-select circuitry 203 includes address decoders and output selectors for use in accessing the information stored in memory arrays 201. Note that conductive bridges 205 electrically connect the interrupted rows and/or columns of ones of memory arrays 201 through decode-select circuitry 203, in accordance with an aspect of the invention. This is described in further detail herein-below.

An address decoder cell, as used herein is at least the driver of a row and any partial circuitry required to select that driver. Thus, address decoder cells may be self contained, or they may share circuitry amongst themselves. The result of the address decoder is output signals, each of which drives a single row of one of memory arrays 201.

An output selector cell, as used herein, is at least the selector of a column which allows the data on the selected column to pass through it, e.g., to an amplifier, to the exclusion of the other columns. This may be made up of a gating function, e.g., implemented by a single transistor, and any partial circuitry required to select that gating function. Thus, output selector cells may be self contained, or they may share circuitry amongst themselves. The result of the output selector is a selection of one column of each of memory arrays 201 from which data will be read.

In one embodiment of the invention the regular spacing between the wires that make up the rows of each memory layer as well as the spacing between the wires that make up the column of each memory layer is the minimum spacing that can be etched, so as to maximize memory cell density. If such regular spacing were to be employed for each and every wire, there would be no room to connect the wires to the row decoders or output selectors at their different layer, which is necessary to make the memory useful.

Therefore, in accordance with an aspect of the invention, gaps are left between ones of the row wires or the column wires of a memory layer, so that connections may be made between a) rows and/or columns and b) the respective row decoder and/or output selector. For the rows, one gap needs to be left for each row decoder that underlies the rows. For example, for an N×M memory, where N is the number of rows and is M is the number of columns, there are required N row decoder cells and M output selector cells. Thus, if identical row decoder cells are used, and they are arranged in an array of J rows by K columns, there will be K gaps in the M columns of column wires. Similarly, if identical column select cells are used, and they are arranged in an array of R rows by S columns, there will be R gaps in the N rows of row wires.

Figure 6:
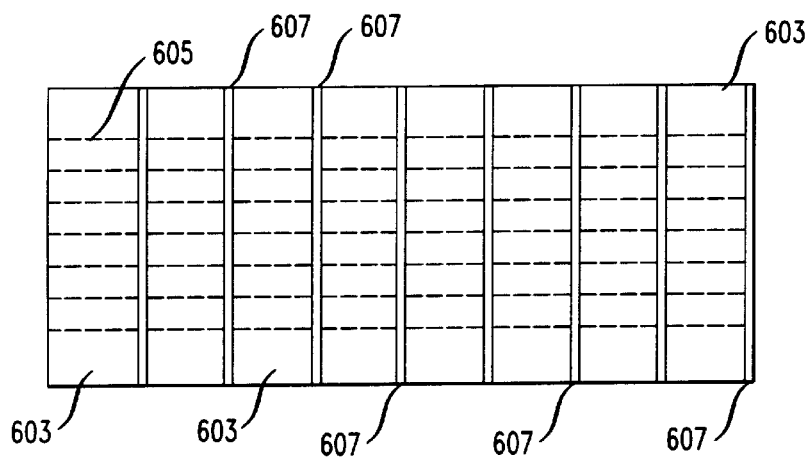
FIG. 6 shows an exemplary row decoder structure for an 8×32 memory.
Figure 7:
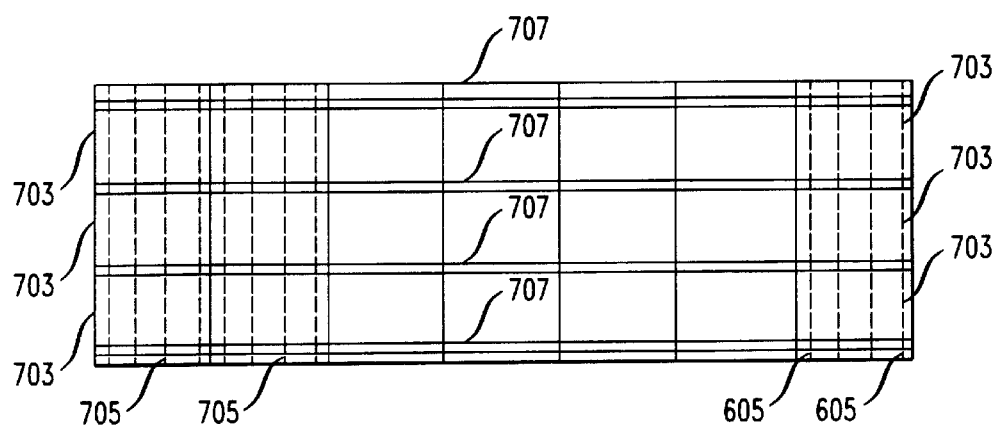
FIG. 7 shows an exemplary column select structure for an 8×32 memory.

To illustrate this, FIG. 6 shows an exemplary row decoder structure for an 8×32 memory. Row decoder cells 603 are arranged in 1 row of 8 columns, i.e., J=1 and K=8. This results in 8 gaps 607 within the 32 columns of wires 605. Similarly, FIG. 7 shows an exemplary column select structure for an 8×32 memory. The column select cells 703 are arranged in 4 row of 8 columns, i.e., R=4 and S=8. Thus, there are 4 gaps 707 within the 8 rows of wires 705.

Figure 3:
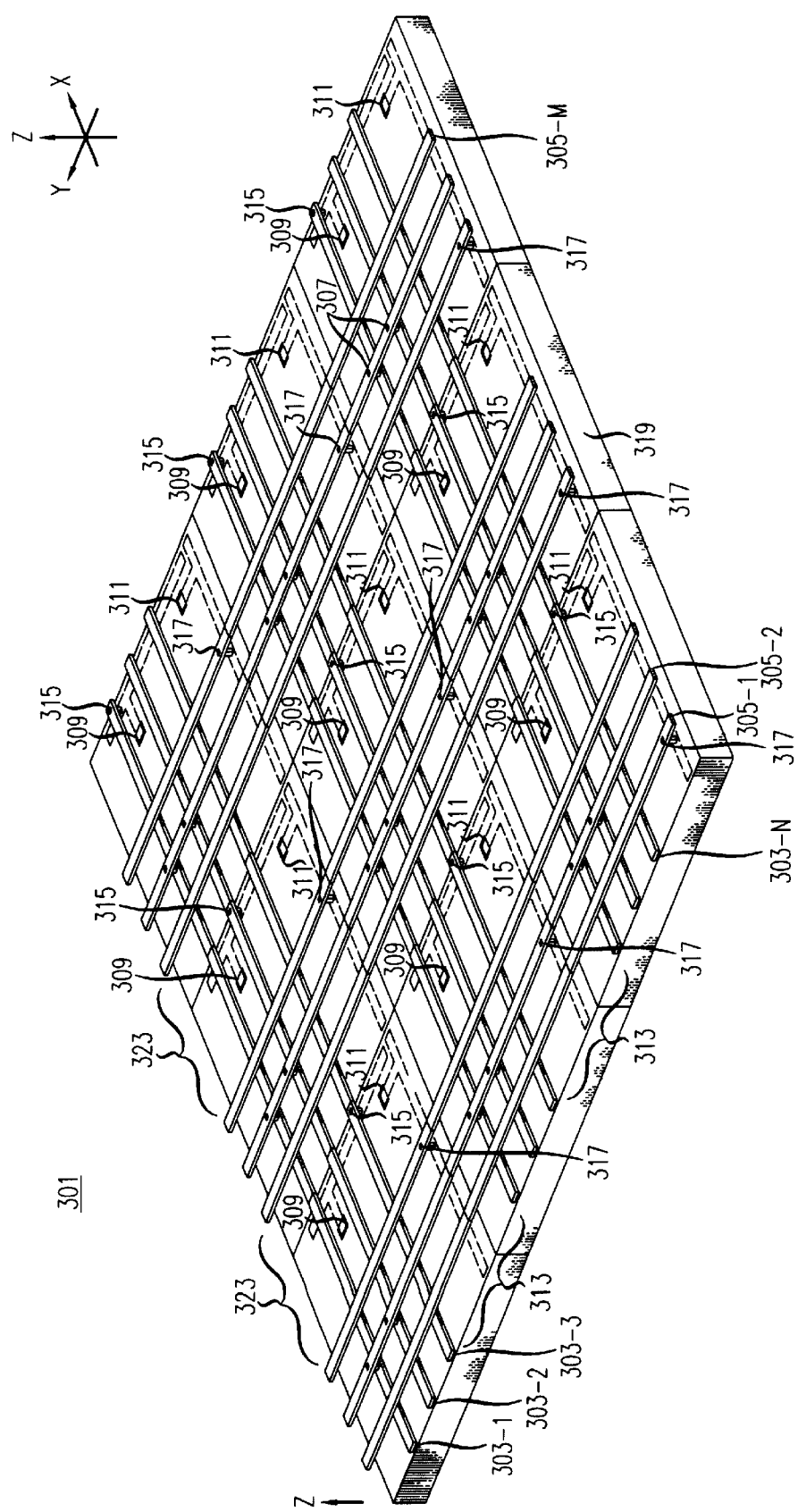
FIG. 3 shows a read only memory structure including one memory array plane and its underlying decode-select circuitry.

For a more detailed view, FIG. 3 shows a read only memory structure 301 including one memory array plane and its underlying decode-select circuitry. Shown are rows 303, including a) rows 303-1 through 303-N; b) columns 305, including columns 305-1 through 305-M; c) various interconnects 307; d) row drivers 309; e) column selectors 311; f) row gaps 313; g) row driver connects 315; h) column selector connectors 317; and column gaps 323. Elements 303, 305, and 307 make up the memory array plane, while elements 309, 311, 315, 317, as well as logic circuitry (not explicitly shown) which is embedded in substrate 319, make up the decode select circuitry for the memory array plane.

At each point where one of rows 303 is connected to one of columns 305 by a one of interconnects 307, a bit is stored. Row drivers 309 carry the signals which are the output of row decoders. These signals are coupled to the various ones of rows 303 via row driver connects 315. Column selectors 311 carry signals which indicate the presence of bits as a function of the row being driven. More specifically, such signals 1) originate from the one of row drivers 309 for the one of rows 303 being driven and are coupled to that row via one of row driver connects 315; 2) pass via one of interconnects 307, if any, to the column being read; and 3) proceed via one of column slectors 311 from the column being read to its corresponding column selector. However, only if a particular column is selected to be read by the decode-select cells is the signal from the column passed on.

Within substrate 319, at least a portion of the row decoder which drives a particular row drivers 309 is located within the vicinity of row driver 309, e.g., within a region that lies between two neighboring row drivers 309. Similarly, within substrate 319, at least a portion of the column selector which selects a particular column via column selector 311 is located within the vicinity of column selector 311. Note that not all of the row driving circuitry or column selecting circuitry need be within the specified vicinities, as it may be desirable to predecode portions of the row and column addresses. Furthermore, any conventional decoding technique may be employed, e.g., serial decoding, random access, or any combination thereof.

All the components of read only memory structure 301 which are shown in FIG. 3, except interconnects 307, are low impedance. Interconnects 307 may be a high impedance type of device, e.g., a resistor, or it may be a substantially directional device, e.g., a diode. In the conventional manner, when interconnects 307 are a high impedance type of device, such as a resistor, then the size of the memory array is limited by the ratio of the impedance of the interconnects to the combined impedances of the other conductors to which it is connected. As is known, the size limit of the memory array is relaxed when using substantially directional devices.

Row gaps 313 are strategically located between rows 303 so that connections may be made from columns 305 to the decode select circuitry located on a different level. In the embodiment of the invention shown in FIG. 3, rows 303 are located between columns 305 and column selectors 311 in the Z-direction. In order to fit in a column selector connector 317 a gap at least the size of one of column selectors 317 is needed so that there is space between the row wires for the column selector connector to drop through without the connector touching any other feature of memory structure 301.

Column gaps 323 serve a similar purpose to row gaps 313, but are only necessary if there were additional memory array planes incorporated into memory structure 301 above the memory array plane shown in FIG. 3. If there was at least one such an additional memory plane, columns 305 would be located between the rows of that additional memory plane and the row drivers for that memory plane in the Z-direction.

However, column gaps alone are insufficient when using wires that are minimally spaced, i.e., no feature can be fit in between the wires. This is because, the rows of an additional memory, such as noted above, plane would run directly above the rows of the memory plane shown in FIG. 3. Thus, there is no clear space through which a row connector can be run to the additional memory plane. Therefore, in accordance with the principles of the invention, a break is introduced in the rows 303, as was described in connection with FIG. 2. Such a two memory plane structure is shown in FIG. 4 for one row and column of FIG. 3 and one row and column of the additional memory plane.

Figure 4:
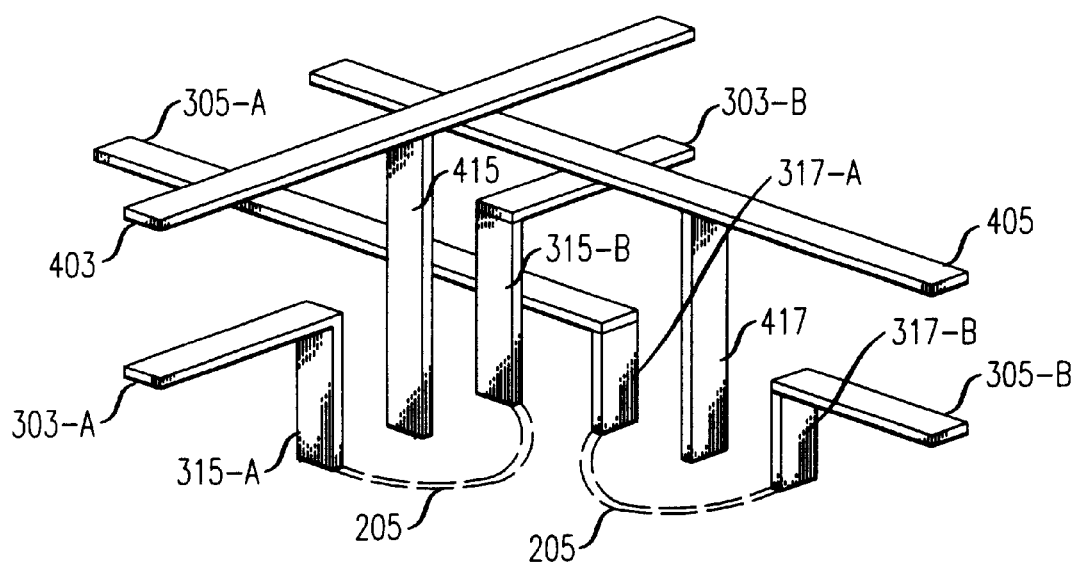
FIG. 4 shows a section of a memory structure in accordance with an aspect of the invention.

In particular, a single row 403 and single column 405 are shown in FIG. 4 for the additional memory plane, as is a single row driver connect 415 and a single column selector connector 417. Note that the row 303 which was previously a single unbroken row 303 in the memory array plane shown in FIG. 3 has been replaced by two row segments 303, namely row segments 303-A and 303-B. Similarly, the row driver connect 315 which previously served the single row 303 has been replaced by two row driver connects 315, namely row driver connects 315-a and 315-B. Note that, as shown in FIG. 4, row driver connect 315-A serves row segment 303-A while row driver connect 315-B serves row segment 303-B. The two row segments 303-A and 303-B are connected in the decode-select circuitry, as they are commonly driven.

In a like manner, column 305, which was previously a single unbroken column in the memory array plane shown in FIG. 3, has been replaced by two column segments 305, namely column segments 305-A and 305-B. Similarly, the column selector connect 317 which previously served the single column 305 has been replaced by two column selector connects 317, namely column selector connects 317-A and 317-B. Note that, as shown in FIG. 4, column selector connect 317-a serves column segment 305-a while column selector connect 317-B serves column segment 305-B. The two column segments 305-A and 305-B are connected in the decode-select circuitry, as the signal from each of them is connected to the same selector input 205.

If even further memory array planes are employed, the rows and columns of each plane except the topmost plane are segmented, as described. The gap between each lower row and column is increased for each plane that is added.

If, instead of adding the additional memory array plane on top of the existing memory array plane shown in FIG. 3 the additional memory array plane is added below the decode-select circuitry within substrate 319, no gap would be necessary. However, any further memory array planes, whether above that shown in FIG. 3 or below that added below substrate 319, would require the introduction of gaps in the memory planes closer to substrate 319.

Figure 5:
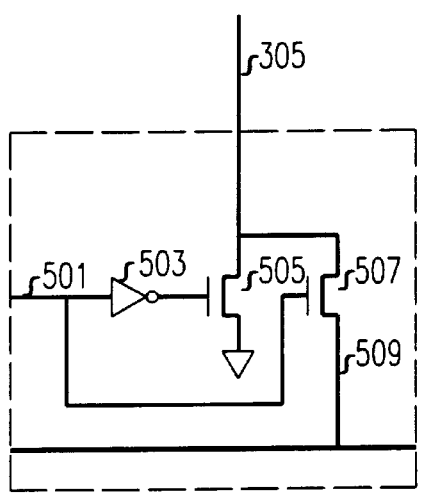
FIG. 5 shows a read circuit in accordance with the principles of the invention.

In accordance with an aspect of the invention, less than all, and preferably only one, of the columns selected for reading at any particular time. All the other columns that are not currently being read are terminated in a low impedance. This may be achieved by employing the read circuit shown in FIG. 5. The state of control signal 501 determines whether the one of columns 305 connected to the read circuit is being read or is connected to low impedance. If control signal 501 is a logic 1, then transistor 507 is on and output 509 takes the value of the one of columns 305. Inverter 503 causes a logic 0 to be applied to transistor 505, causing it to be off. Conversely, if control signal 501 is a logic 0, then transistor 507 is off, disconnecting the one of columns 305 from output 509. However, inverter 503 causes a logic 1 to be applied to transistor 505, turning it on. This causes the one of columns 305 to be connected to ground, which is a low impedance. Advantageously, cross talk is reduced, allowing the memory array to be larger.

The foregoing merely illustrates the principles of the invention. It will thus be appreciated that those skilled in the art will be able to devise various arrangements which, although not explicitly described or shown herein, embody the principles of the invention and are included within its spirit and scope.

What is claimed is:

1. A read only memory, comprising:
   a two-dimensional array of read only memory cells in a layer; and
   a row decoder for selecting a portion of said two-dimensional array of memory cells, said row decoder being located in a layer that is different from said layer of said two-dimensional array of read only memory cells;
   wherein said layer of said row decoders is above at least said layer of said two-dimensional array of read only memory cells.

2. The invention as defined in claim 1 wherein said two-dimensional array of read only memory cells is arranged into said layer and another layer, and wherein said layer of said row decoder is below said other layer of said two-dimensional array of read only memory cells.

3. A read only memory, comprising:
   a two-dimensional array of read only memory cells in a layer; and
   an output selector for reading information from a portion of said two-dimensional array of memory cells, said output selector being located in a layer that is above said layer of said two-dimensional array of read only memory cells.

4. The invention as defined in claim 3 wherein said output selector is a two-dimensional array of column selectors.

5. The invention as defined in claim 3 wherein said output selector includes an amplifier.

6. The invention as defined in claim 3 wherein only one column is selected by said output selector for each read of said memory array.

7. A read only memory, comprising:
   a two-dimensional array of read only memory cells in a layer; and
   a memory reading circuit for reading a portion of said two-dimensional array of memory cells, said memory reading circuit being located in a layer that is different from said layer of said two-dimensional array of read only memory cells;
   wherein said layer of said memory reading circuit is above at least said layer of said two-dimensional array of read only memory cells.

8. The invention as defined in claim 7 wherein said memory reading circuit includes decode-select circuit.

9. The invention as defined in claim 7 wherein said memory reading circuit includes row drivers.

10. The invention as defined in claim 7 wherein said memory reading circuit includes column selectors.

11. The invention as defined in claim 7 wherein said memory reading circuit includes circuit means for connecting one or more columns of said at least one layer of said two-dimensional array of read only memory cells to ground when said one or more columns are not being selected for reading.

12. The invention as defined in claim 7 wherein said two-dimensional array of read only memory cells is arranged into said layer and another layer, and wherein said layer of said memory reading circuit is below said other layer of said two-dimensional array of read only memory cells.

* * * * *